United States Patent
Naiss et al.

(10) Patent No.: US 10,262,728 B2
(45) Date of Patent: Apr. 16, 2019

(54) MAPPING BITS TO MEMORY CELLS USING SECTOR SPREADING

(71) Applicant: SAMSUNG ELECTRONICS CO., LTD., Suwon-si, Gyeonggi-do (KR)

(72) Inventors: Iddo Naiss, Ramat Gan (IL); Noam Livne, Ramat Gan (IL); Elona Erez, Ramat Gan (IL); Jun Jin Kong, Yongin-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 60 days.

(21) Appl. No.: 15/288,443

(22) Filed: Oct. 7, 2016

(65) Prior Publication Data
US 2018/0102168 A1    Apr. 12, 2018

(51) Int. Cl.
G06F 11/10 (2006.01)
G11C 11/56 (2006.01)
G11C 29/52 (2006.01)
G11C 29/00 (2006.01)

(52) U.S. Cl.
CPC ...... *G11C 11/5642* (2013.01); *G06F 11/1068* (2013.01); *G11C 11/5628* (2013.01); *G11C 29/52* (2013.01)

(58) Field of Classification Search
CPC . G11C 11/5642; G11C 29/52; G11C 11/5628; G06F 11/1068
See application file for complete search history.

(56) References Cited

U.S. PATENT DOCUMENTS

| | | | |
|---|---|---|---|
| 9,542,258 B1* | 1/2017 | Lu | G06F 11/0793 |
| 2009/0059662 A1* | 3/2009 | Woo | G11C 16/0483 365/185.03 |
| 2009/0292972 A1* | 11/2009 | Seol | G11C 16/26 714/763 |
| 2010/0122146 A1* | 5/2010 | Nazarian | G06F 11/1072 714/763 |
| 2010/0142276 A1* | 6/2010 | Kasuga | G11C 16/26 365/185.11 |
| 2010/0321999 A1* | 12/2010 | Yoo | G11C 11/5628 365/185.03 |
| 2011/0141833 A1* | 6/2011 | Haines | G11C 11/5628 365/189.16 |
| 2013/0024742 A1* | 1/2013 | Nazarian | G06F 11/1072 714/758 |

* cited by examiner

*Primary Examiner* — Guy J Lamarre
(74) *Attorney, Agent, or Firm* — F. Chau & Associates, LLC (57) ABSTRACT

A method for storing data multi-level cell (MLC) memory includes receiving data to be stored. The received data is divided into units of x bits, where x is an integer greater than or equal to 3. Each of the units of x bits is stored over a span of y memory cells of the MLC memory. Here, y is an integer greater than or equal to 2. At least one bit of each of the x bits is stored only partially in a first memory cell of the span of y memory cells and the at least one bit is also stored, only partially, in a second memory cell of the span of y memory cells such that the at least one bit cannot be interpreted without reading both the first and second memory cell of the span of y memory cells.

7 Claims, 7 Drawing Sheets

| R1 Cell-0 = 0 ➔ MSB = 0 | |
|---|---|
| R0 Cell-0 = 0 | ➔ LSB1 = 1 |
| R0 Cell-1 = 1 | |
| R2 Cell-0 = 1 | ➔ LSB2 = 0 |
| R2 Cell-1 = 1 | |

MAPPING BITS TO MEMORY CELLS USING SECTOR SPREADING

TECHNICAL FIELD

The present disclosure relates to mapping bits to memory cells and, more specifically, to mapping bits to memory cells using sector spreading.

DISCUSSION OF THE RELATED ART

Non-volatile memory, such as flash memory, is useful for storing data without the need to continuously refresh the memory stored therein so that data may remain stored for long periods of time without the need for electrical power. A flash memory module includes a large number of memory cells. Traditionally, each memory cell has been able to store only a single bit of information. This approach, which is known as single-level cell (SLC) memory, stores a single bit in each cell by programming the cell to a particular voltage that is either greater than a predetermined threshold or lower than the predetermined threshold.

More recently, an approach known as multi-level cell (MLC) memory has been developed that allows for an arbitrary number of bits of data to be stored in each cell. For example, four bits of data may be stored in each memory cell by programming the cell to a particular voltage that is either lower than a first predetermined threshold, between the first predetermined threshold and a second predetermined threshold, between the second predetermined threshold and a third predetermined threshold, or higher than the third predetermined threshold.

However, the problem with MLC memory devices, such as those discussed above, is that a relatively large number of reference voltages must be used to read the memory cell. For example, only a single reference voltage is needed to read SLC memory cells, i.e. only the one threshold voltage is used to read one bit of data. For the MLC memory cell described above, three reference voltages are needed to read the memory cell that is capable of storing two bits of data in one of four different memory levels, as the voltage read therefrom must be compared against as many as three threshold voltages.

This problem becomes more acute as a greater number of data bits are stored in each cell. In general, the average number of references needed to read MLC memory cells is $$\frac{2^n - 1}{n},$$

where n is the number of bits stored in each cell, and each cell has $2^n$ levels. Thus, where n=2, which is to say, there are four different memory levels per cell, the average number of references needed to read the cell is 1.5.

Moreover, as a greater number of bits are stored in each cell, the difference in voltage between different bit values becomes less, and this may lead to an increased likelihood that a given cell, once programmed, may jump levels, either up or down.

SUMMARY

A method for storing data multi-level cell (MLC) memory includes receiving data to be stored. The received data is divided into units of x bits, where x is an integer greater than or equal to 3. Each of the units of x bits is stored over a span of y memory cells of the MLC memory. Here, y is an integer greater than or equal to 2. At least one bit of each of the x bits is stored only partially in a first memory cell of the span of y memory cells and the at least one bit is also stored, only partially, in a second memory cell of the span of y memory cells such that the at least one hit cannot be interpreted without reading both the first and second memory cell of the span of y memory cells.

Here, x may be equal to 3 and y may be equal to 2. Here, x may be greater than y. The stored units of x bits may be read from the MLC memory with an average number of references per sector of less than $$\frac{2^n - 1}{n},$$

where $2^n$ is a number of levels of the MLC memory. The units of x bits may each include a most significant bit (MSB) and at least two least significant bits (LSBs). The MSB may be stored exclusively in the first memory cell of the span of y memory cells and each of the LSBs may be stored such that neither of the at least two LSBs can be interpreted without reading both the first and second memory cell of the span of y memory cells.

Each of the at least two LSBs may be stored such that they must be read as an XOR of a reading of both the first and second memory cell of the span of y memory cells.

In storing each of the units of x bits over a span of y memory cells of the MLC memory, there may be a plurality of different constellations that represent the x bits and a selection of which of the plurality of different constellations to use is determined according to an error correction code (ECC) bit.

A method for reading three-bit data from a pair of four-level cell memory, includes determining whether a first cell of the pair is programmed above or below a second reference voltage and establishing a most significant bit (MSB) of the three-hit data from this determination. It is determined whether the first cell of the pair is programmed above or below a first reference voltage that is higher than the second reference voltage. It is determined whether a second cell of the pair is programmed above or below the first reference voltage. A first least significant bit (LSB1) of the three-hit data is established as a result of an XOR of the result of the determination as to whether the first cell of the pair is programmed above or below the first reference voltage and the determination as to whether the second cell of the pair is programmed above or below the first reference voltage. It is determined whether the first cell of the pair is programmed above or below a third reference voltage that is lower than the second reference voltage. It is determined whether the second cell of the pair is programmed above or below the third reference. A second least significant bit (LSB2) of the three-bit data is established as a result of an XOR of the result of the determination as to whether the first cell of the pair is programmed above or below the third reference voltage and the determination as to whether the second cell of the pair is programmed above or below the third reference voltage.

The three-bit data may be read from the pair of four-level cell memory with an average number of references per sector of less than 1.5.

A memory device includes an interface for communicating with a host device. The memory device further includes a plurality of multi-level memory cells. A controller stores data received from the host device to the plurality of multi-level memory cells and the controller reads data stored in the plurality of multi-level memory cells. The controller is configured to receive data to be stored, divide the received data into units of x bits, where x is an integer greater than or equal to 3, and store each of the units of x bits over a span of y memory cells of the plurality of multi-level memory cells. Here y is an integer greater than or equal to 2. At least one bit of each of the bits is stored only partially in a first memory cell of the span of y memory cells and the at least one bit is also stored, only partially, in a second memory cell of the span of y memory cells such that the at least one bit cannot be read without reading both the first and second memory cell of the span of y memory cells.

Here, x may be equal to 3 and y may be equal to 2. Here, x may be greater than y. The stored units of x bits may be read from the MLC memory with an average number of references per sector of less than $$\frac{2^n - 1}{n},$$

where $2^n$ is a number of levels of the MLC memory. The units of x bits may each include a most significant bit (MSB) and at least two least significant bits (LSBs), the MSB is stored exclusively in the first memory cell of the span of y memory cells and each of the LSBs may be stored such that neither of the at least two LSBs can be read without reading both the first and second memory cell of the span of y memory cells. Each of the at least two LSBs may be stored such that it is be read as an XOR of a reading of both the first and second memory cell of the span of y memory cells. In storing each of the units of x bits over a span of y memory cells of the MLC memory, there may be a plurality of different constellations that represent the x hits and a selection of which of the plurality of different constellations to use is determined according to an error correction code (ECC) bit.

A method for storing data to a plurality of four-level cell memory includes receiving data to be stored. The received data is divided into units of 3 bits. Each of the 3-bit units is stored into a corresponding pair of memory cells of the plurality of four-level cell memory. At least one bit of each 3-bit unit is stored only partially in a first cell of the pair of memory cells and the at least one hit is also stored, only partially, in a second cell of the pair of memory cells such that the at least one bit cannot be interpreted without reading both the first and second cell of the pair of memory cells.

The data may be read from the plurality of four-level cell memory with an average number of references per sector of less than 1.5. Each 3-bit unit may include a most significant bit (MSB) and at least two least significant bits (LSBs). The MSB may be stored exclusively in the first cell and each of the LSBs is stored such that neither of the at least two LSBs can be interpreted without reading both the first and second cells. An error correction code (ECC) bit may be stored in at least one pair of memory cells of the plurality of four-level cell memory, in addition to its corresponding 3-bit unit, by selecting which of a plurality of different consecrations that represents the 3-bit unit to use in the storing of the corresponding 3-bit unit.

The at least one pair of memory cells may include a first pair of memory cells and a second pair of memory cells, each including an ECC bit stored therein. The EEC bit may be stored in the first and second pair of memory cells in a cyclic way, with respect to each other, such that the decoding of the ECC bit of the first pair of memory cells is used in decoding of the ECC bit of the second pair of memory cells when the ECC bit of the second pair of memory cells is not successfully decoded. The plurality of four-level cell memory may be part of an input buffer.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE DRAWINGS

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Exemplary embodiments of the present invention seek to reduce the average number of references needed to read data stored in MLC flash memory and to increase the accuracy associated with storing multiple bits of data within a flash memory device. This may be done by changing the way in which bits are encoded into memory. For example, rather than storing a certain number of bits within a single memory cell (for example, storing 2 bits of data in each memory cell, as described above), exemplary embodiments of the present invention seek to store a certain number of bits within pairs of memory cells. For example, rather than storing 2 bits within each memory cell, 3 bits may be stored within each pair of memory cells. While this approach may reduce the total number of storable bits within a given number of memory cells, this approach may also reduce the number of references needed to read stored data from $$\frac{2^n-1}{n} \text{ to } \frac{2^n-1}{2n-1}.$$

Accordingly, in the example discussed above, in which each memory cell has 4 levels (n=2), using the traditional approach for mapping, an average of 1.5 references are needed to read each memory cell, while according to exemplary embodiments of the present invention, where n=2, an average of 1.0 references are needed to read each memory cell.

According to another exemplary embodiment of the present invention, 2n bits of data may be stored in groups of 1.5 cells, each of which is a $2^n$ level cell. For example, where n=2, 6 bits of data may be stored in groups of 3, four-level cells. Where this approach is performed, the average number of references per sector may be equal to $$\frac{1.5 \times 2^n - 1}{2n}.$$

Both of these approaches may be described herein as "sector spreading" because rather than encoding one or more bits entirely within a single memory cell, the encoding of the one or more bits is spread across more than one memory cell.

It is to be understood that while exemplary embodiments of the present invention are described herein with reference to memory cells having a number of levels that is represented as $2^n$, where n is a positive integer (such as memory cells having 2, 4, 8, 16, etc. levels), it is to be understood that the approaches described herein may be applied to memory cells having any number of levels, such as 3 or 5 levels per-cell, as long as pairs of memory cells are used. Additionally, exemplary embodiments of the present invention could be expanded to encode data within a greater number of memory cells than in pairs, for example, exemplary embodiments of the present invention may be expanded to encode data within triples or a higher number of cell groupings.

According to traditional approaches for reading MLC memory, for example, where it is assumed that n=2 and each cell has 4 levels (L0, L1, L2, and L3), it is understood that a programmed memory cell may have one of 4 different levels and the level of a particular memory cell may be read as being less than a first reference (X<R0 is L0), between the first and a second reference (R0<X<R1 is L1), between the second and a third reference (R0<X<R2 is L2), or being greater than the third reference (X>R2 is L3). However, this does not mean that all three references are needed to read every memory cell. On the contrary, traditional reading approaches may read a programmed memory cell by first determining if the cell is above or below the second reference (R1). This is referred to as reading the most significant bit (MSB). The MSB may be determined to be "1" where the memory cell is less than the second reference R1 or "0" where the memory cell is greater than the second reference R1 (although the actual mapping of 1 or 0 is arbitrary). The least significant bit (LSB) is read by reading both R0 and R2 for the memory cell, where R0 is a first reference and R2 is a third reference.

Figure 1:
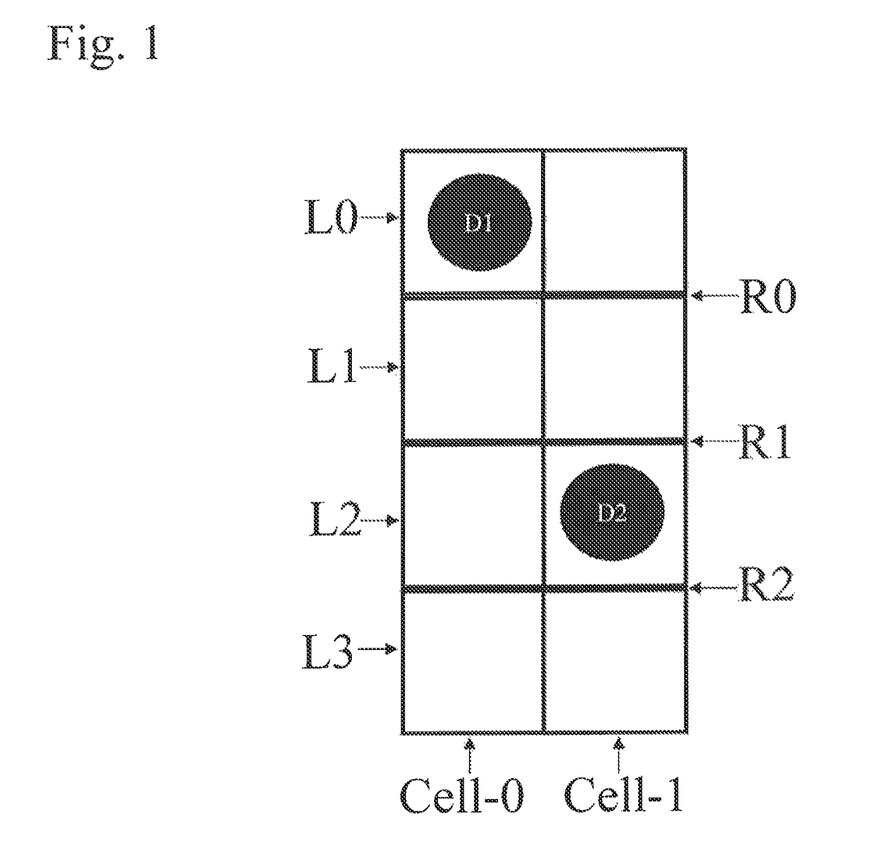
FIG. 1 is a diagram illustrating an approach for storing 3-bits of data within a pair of 4-level memory cells in accordance with exemplary embodiments of the present invention.
Figure 2:
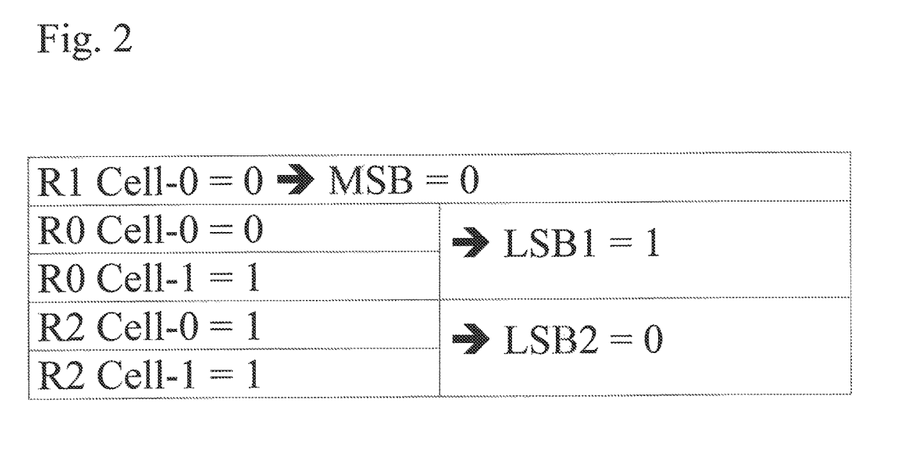
FIG. 2 is a table illustrating an approach for reading the data stored in the pair of memory cells illustrated in FIG. 1.

In contrast, according to exemplary embodiments of the present invention, each pair of memory cells is used to store 3 bits of data, which may be referred to herein as a MSB, a first LSB (LSB1), and a second LSB (LSB2). FIG. 1 is a diagram illustrating an approach for storing 3-bits of data within a pair of 4-level memory cells in accordance with exemplary embodiments of the present invention. FIG. 2 is a table illustrating an approach for reading the data stored in the pair of memory cells illustrated in FIG. 1. It is to be understood, however, that as mentioned above, this approach may be expanded to utilize pairs of memory cells having any number of levels.

As seen in FIG. 1, the MSB is stored in the first memory cell of the pair ("Cell-0"), either above the second reference R1 (If X>R1 then MSB=0), or below the second reference R1 (If X<R1 then MSB=1). The second cell ("Cell-1") will always store the opposite of the MSB and so where the first memory cell Cell-0 of the pair is above the second reference R1, the second memory cell Cell-1 of the pair will always be below the second reference R1, and where the first memory cell Cell-0 of the pair is below the second reference R1, the second memory cell Cell-1 of the pair will always be above the second reference R1.

The LSB1 and LSB2 may then be read from the pair of memory cells. This may be done by reading both memory cells and comparing the reading to both R0 and R2. While the manner for representing LSB1 and LSB2 from the above readings may be arbitrary, exemplary embodiments of the present invention may define LSB1 as the XOR result of the R0 comparison for the first cell with the R0 comparison of the second cell, and LSB2 may be defined as the XOR result of the R2 comparison of the first cell with the R2 comparison of the second cell.

For example, as seen in FIG. 1 two data D1 and D2 have been stored. Data D1 has been stored in L0 of Cell-0 and Data D2 has been stored in L2 of Cell-1. Then to read the data, as shown in FIG. 2, first Cell-0 is compared to reference R1. As the data D1 is above the R1 reference, the MSB is read as 0. Then Cell-0 is compared to reference R0. As the data D1 is above the R0 reference, the result is 0. Then Cell-1 is compared to reference R0. As the data D2 is below the R0 reference, the result is 1. The XOR is found for the above two readings, and as the XOR is 1, the LSB1=1.

Then to read LSB2, Cell-0 is compared to reference R2. As the data D1 is above the R2 reference, the result is 1. Then Cell-1 is compared to reference R2. As the data D2 is above the R2 reference, the result is 1. The XOR is found for the above two readings, and as the XOR is 0, the LSB2=0. Accordingly, the 3-bit data stored in the pair of memory cells is "010".

As discussed above, as the number of levels within an MLC memory increases, the chances of a programmed cell jumping up or down one level increase. This probability may be referred to herein asp. Table I provided below illustrates the number of levels, the average number of references per sector, the worst case number of references, and the worst case bit error rate (BER) according to the prior art approach and two exemplary embodiments of the present invention:

TABLE 1

| | Levels | Avg. Ref./Sec. | Worst Case Refs. | Worst Case BER |
|---|---|---|---|---|
| Conventional n-bit Mapping (n > 0) | $2^n$ | $\dfrac{2^n - 1}{n}$ | $\left\lceil \dfrac{2^n - 1}{n} \right\rceil$ | $\left\lceil \dfrac{\frac{2^n - 1}{n}}{2^n} \right\rceil p$ |
| New n-bit Mapping (n > 1) | $1.5 \times 2^n$ | $\dfrac{1.5 \times 2^n - 1}{2n - 1}$ | $n$ | $\dfrac{2n}{2^n} p$ |
| New n + 0.5-bit Mapping (n > 0) | $2^{n+1}$ | $\dfrac{2^{n+1} - 1}{2n + 1}$ | $n$ | $\dfrac{2n}{2^n} p$ |

While exemplary embodiments of the present invention may reduce the probability of jumping, the probability may still exist and accordingly, exemplary embodiments of the present invention may utilize various approaches for adding redundancy to the manner in which data is encoded into the memory cells.

It is to be understood that as used herein, the phrase "constellation" is used to describe a particular pattern of programming a pair of cells (or other grouping of cells, such as groups of 1.5 as described above). Thus, for 4-level cells, the constellation is represented as the data of both cells expressed together.

As discussed above, where the first cell of the pair of cells is above the R1 voltage, the second cell of the pair must be below the R1 voltage and vice versa. This means that there are certain constellations of levels within the pair of programmed cells that may never occur according to these rules. For example, where n=2, there may be 16 possible constellations with only 8 of those constellations that could occur in accordance with the description above. Moreover, there may be multiple different constellations for representing the same data. Thus, these constellations that represent the same data are referred to herein as "synonymous constellations". It is to be understood that the non-permitted constellations will always have synonymous constellations that are permitted.

According to exemplary embodiments of the present invention, these non-permitted constellations and/or synonymous constellations may be used for increasing error correction capabilities. It is to be understood that data may be stored in memory along with error correction codes (ECC) and that these non-permitted constellations and/or synonymous constellations may be used to store additional error correction codes in addition to the ECC that would otherwise be used.

Figure 3:
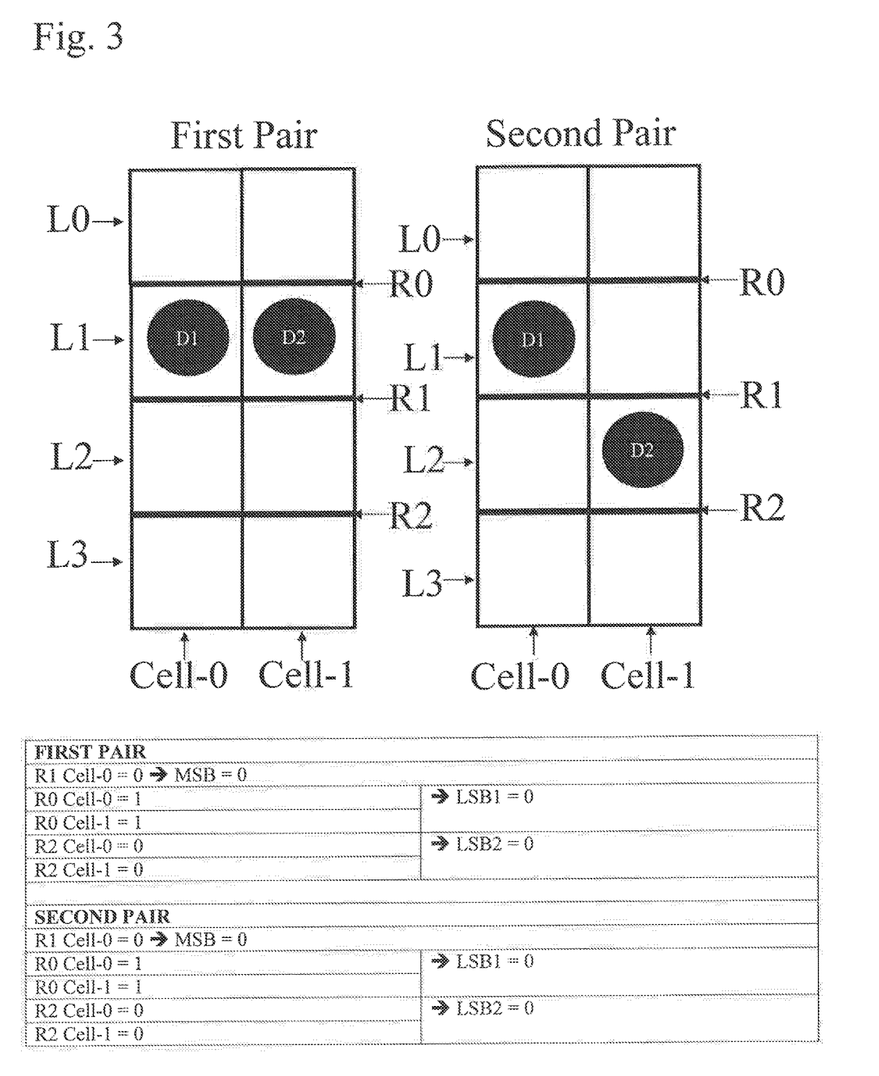
FIG. 3 is a diagram illustrating an approach for encoding additional ECC bits in data stored using pairs of memory cells in accordance with exemplary embodiments of the present invention.

For example, one or more ECC bits may be added to certain representations of data. FIG. 3 is a diagram illustrating an approach for encoding additional ECC bits in data stored using pairs of memory cells in accordance with exemplary embodiments of the present invention. As may be seen from FIG. 3, the three-bit data "000" may be stored as shown in the First Pair or as shown in the Second Pair.

In the First Pair, D1 data is stored in Cell-0 at L1 and D2 data is stored in Cell-1 at L1. This data may then be read by comparing Cell-0 to R1 to determine MSB=0, comparing Cell-0 to RU to get a value of 1, comparing Cell-1 to R0 to get a value of 1, finding the XOR of 1 and 1 to be 0 and thereby determining that LSB1=0. Then comparing Cell-0 to R2 to get a value of 0, comparing Cell-1 to R2 to get a value of 0, finding the XOR of 0 and 0 to be 0 and thereby determining that LSB2=0.

Then, in the Second Pair, D1 data is stored in Cell-0 at L1 and D2 data is stored in Cell-1 at L2. This data may then be read by comparing Cell-0 to R1 to determine MSB=0, comparing Cell-0 to RU to get a value of 1, comparing Cell-1 to R0 to get a value of 1, finding the XOR of 1 and 1 to be 0 and thereby determining that LSB1=0. Then comparing Cell-0 to R2 to get a value of 0, comparing Cell-1 to R2 to get a value of 0, finding the XOR of 0 and 0 to be 0 and thereby determining that LSB2=0.

It is clear from this example that the rule expressed above regarding Cell-1 having the opposite reading with respect to R1 than Cell-0 has been relaxed so that there may be additional ways to express the "000" data.

Moreover, there may still be other ways in which the "000" data may be expresses, such as programming Cell-1 to L0 and programming Cell-1 to L0. This example is not shown in FIG. 3.

Thus, the First Pair representation may represent the case in which the FCC bit is 0 and the Second Pair representation may represent the case in which the FCC bit is 1.

In fact, certain data may be represented as one of four different synonymous constellations. For example, LSB1=1, MSB=0, LSB2=0 may be represented as either first cell L0, second cell=L2; first cell=L0, second cell=L1; first cell=L1, second cell=L0; or first cell=L0, second cell L0. Accordingly, two FCC bits may be encoded by the selection of the particular synonym constellation. For example, the first arrangement may express ECC=00, the second arrangement may express FCC=01, the third arrangement may express ECC=10, and the fourth arrangement may express ECC=11.

It is to be understood that in order to read these FCC bits, the average number of references per sector may have to increase as compared with the examples described above in which no additional ECC bits are encoded. However, according to exemplary embodiments of the present invention, the extra FCC bits need not be read in the ordinary course, and therefore, reading speed may be significantly increased owing to the reduced number of average references needed per sector. However, when a page failure occurs during reading, the FCC bits may then be read to attempt to restore the lost data.

In using the above approach, there might be certain circumstances in which the jumping up or down of programmed cells may cause a pair of memory cells to look like an extra ECC bit has been added, when in fact it has not been. Another possibility is that pairs of memory cells that do have an extra ECC bit added to them may be deleted. This may be referred to herein as an "deletion insertion" problem.

Figure 4:
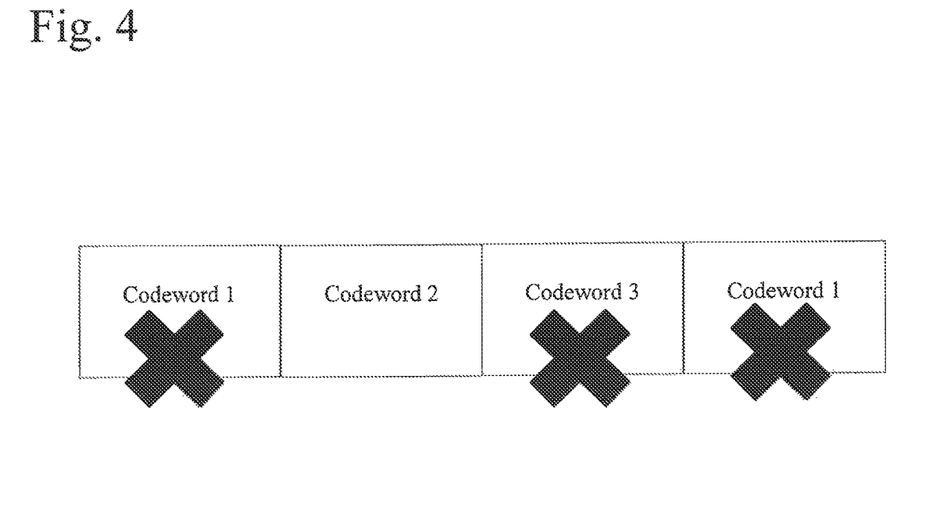
FIG. 4 is a diagram for explaining a solution to the deletion insertion problem discussed above in accordance with exemplary embodiments of the present invention.

FIG. 4 is a diagram for explaining a solution to the deletion insertion problem discussed above in accordance with exemplary embodiments of the present invention. Here, there may be several ECC codewords stored in a sector. For example, four FCC codewords are shown (Codeword1, Codeword2, Codeword3, and Codeword4). Assuming that only one codeword is successfully decoded (e.g. Codeword2), but that the ECC redundancy for Codeword1 was incorporated into Codeword2, since Codeword2 was successfully decoded, the ECC additional redundancy of Codeword1 may be read without insertions or deletions. Based on this redundancy, Codeword1 may be read with high probability. Now assuming that Codeword1 similarly incorporated the additional redundancy of Codeword4, Codeword4 may be read with a high probability. Assuming Codeword4 included the additional redundancy of Codeword3, Codeword3 may be similarly read with a high probability. In this way, all of the codewords may be read in a cyclical way. Therefore, as long as one codeword is successfully decided, the other codewords may be decoded with a high probability, without the problem of deletion insertion.

According to some exemplary embodiments of the present invention, the order in which the codewords are decoded need not be cyclic; rather, a predetermined decoding order may be used.

Figure 5:
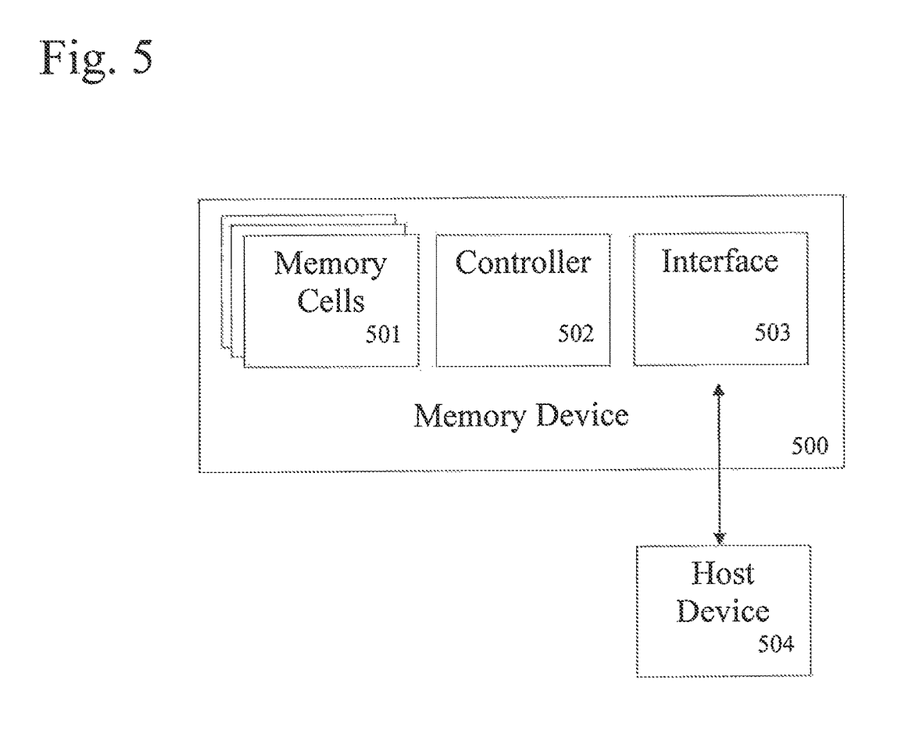
FIG. 5 is a schematic diagram illustrating a system for performing the above-described approach for sector spreading in accordance with exemplary embodiments of the present invention.

FIG. 5 is a schematic diagram illustrating a system for performing the above-described approach for sector spreading in accordance with exemplary embodiments of the present invention.

A memory device 500 may include a plurality of memory cells 501. One or more controllers 502 may be used to read and write data to the memory cells 501, for example, in accordance with the sector spreading techniques described above. An interface 503 may communicate with a host device 404 so that the host device 504 can supply data to be stored in the memory cells 401 and so that the host device 504 can be provided with data that is read from the memory cells 504. While in the above-described approach, the memory controller 502 is configured to read and write data according to the above-described sector spreading techniques, alternatively, the memory controller 405 may be conventional and the host device 405 may be configured to arrange for the reading and writing of data to the memory cells 504 in accordance with the above-described sector spreading techniques.

Figure 6:
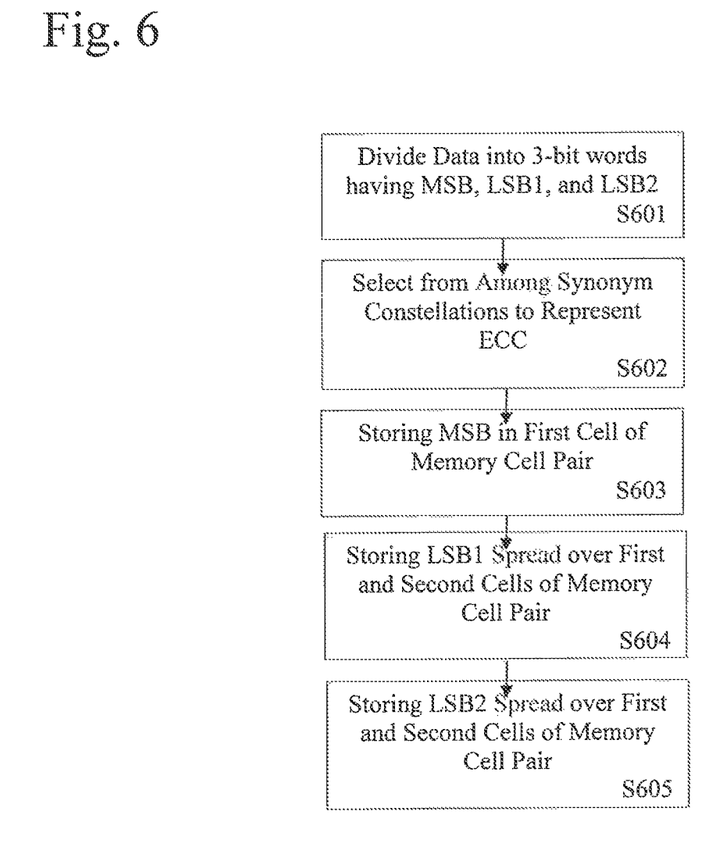
FIG. 6 is a flow chart illustrating an approach for storing data to memory cells by sector spreading in accordance with exemplary embodiments of the present invention.

FIG. 6 is a flow chart illustrating an approach for storing data to memory cells by sector spreading in accordance with exemplary embodiments of the present invention.

In storing data to the memory cells in accordance with exemplary embodiments of the present invention, first the data to be stored may be partitioned into 3-bit words including an MSB, an LSB2, and an LSB2 (Step S601). The partition may occur as the data is stored. Then, where the FCC approach discussed above is to be used, if there are multiple ways in which the 3-bit data may be stored, the synonym constellation may be selected so as to represent the FCC bit (Step S602). The 3-bit data may then be stored in a pair of memory cells, for example, by storing the MSB in the first cell of the memory cell (Step S603). Then, the LSB1 and LSB2 bits may be spread over the first and second cells in accordance to the approach discussed above (Steps S604 and S605). It is to be understood that in so doing, where ECC is not used, the second memory cell will be programmed so as to have an opposite reading, with respect to the middle reference value, as the first memory cell would have. Where ECC is used, this rule may be relaxed for the sake of providing additional synonymous constellations.

Figure 7:
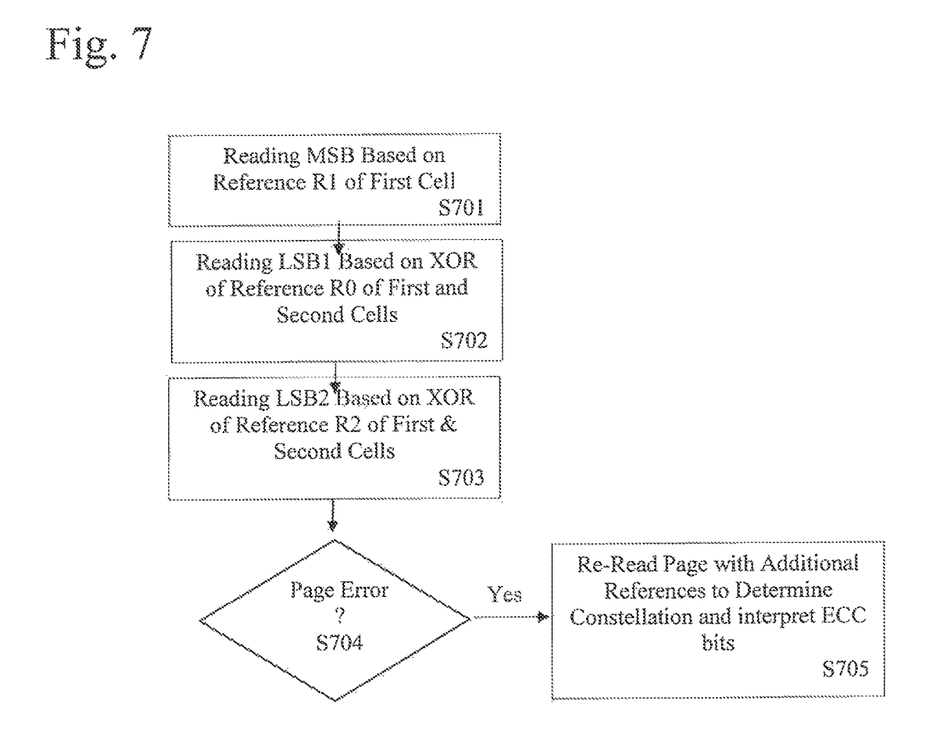
FIG. 7 is a flow chart illustrating an approach for reading data from memory cells that has been stored by sector spreading in accordance with exemplary embodiments of the present invention.

FIG. 7 is a flow chart illustrating an approach for reading data from memory cells that has been stored by sector spreading in accordance with exemplary embodiments of the present invention.

In reading the memory, the MSB may be read from the first cell based on the middle reference (R1) (Step S701). Then, LSB1 and LSB2 may be interpreted based on reading the first and second cells at the R0 and R2 references (Steps S702 and S703).

The memory may be so-read page-by-page if a given page is read correctly, without error, then this approach will have reduced the number of references needed to read a comparable amount of data as compared to known approaches for reading similarly structured memory. However, in the event of a page error (Yes, Step S704), the page may be re-read according to a more conventional approach that utilizes more references and is thereby able to distinguish between synonymous constellations and thereby decode ECC bits (Step S705). The decoded FCC bits may thereafter be used to potentially correct the errors in the page.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A method for storing data multi-level cell (MLC) memory, comprising:
   receiving data to be stored;
   dividing the received data into units of 3 bits including a most significant bit (MSB), a first least significant bit (LSB1), and a second least significant bit (LSB2);
   storing the MSB into a first cell of the MLC memory with reference to a second reference voltage (R1);
   storing the LSB1 spread acrooss the first cell of the MLC memory and a second cell of the MLC memory with reference to a first reference voltage (R0) that is greater than the second reference voltage (R1) and a third reference voltage (R2) that is less than the second reference voltage (R1);
   storing the LSB2 spread across the first cell of the MLC memory and the second cell of the MLC memory with reference to the first reference voltage (R0) and a third reference voltage (R2); and reading from the MLC memory with an average number of references per sector of less than $(2^n-1)/n$, where $2^n$ is a number of levels of the MLC memory.

2. The method of claim 1, wherein each of the first and second cells of the MLC memory have 4 levels.

3. The memory of claim 1, wherein the 3 bits are stored into the MLC memory such that when the first memory cell is programmed above the second reference voltage (R1), the second memory cell is programmed below the second reference voltage (R1) and when the first memory cell is programmed below the second reference voltage (R1), the second memory cell is programmed above the second reference voltage (R1).

4. The method of claim 1, wherein the LSB1 is stored as the XOR of the first cell with respect to the first reference voltage (R0) compared to the second cell with respect to the first reference voltage (R0) while the LSB2 is stored as the XOR of the first cell with respect to the third reference voltage (R2) compared to the second cell with respect to the third reference voltage (R2).

5. The method of claim 1, wherein the LSB2 is stored as the XOR of the first cell with respect to the first reference voltage (R0) compared to the second cell with respect to the first reference voltage (R0) while the LSB1 is stored as the XOR of the first cell with respect to the third reference voltage (R2) compared to the second cell with respect to the third reference voltage (R2).

6. A method for reading three-bit data from a pair of four-level cell memory, comprising:
  determining whether a first cell of the pair is programmed above or below a second reference voltage and establishing a most significant bit (MSB) of the three-bit data from this determination;
  determining whether the first cell of the pair is programmed above or below a first reference voltage that is higher than the second reference voltage;
  determining whether a second cell of the pair is programmed above or below the first reference voltage;
  establishing a first least significant bit (LSB1) of the three-bit data as a result of an XOR of the result of the determination as to whether the first cell of the pair is programmed above or below the first reference voltage and the determination as to whether the second cell of the pair is programmed above or below the first reference voltage;
  determining whether the first cell of the pair is programmed above or below a third reference voltage that is lower than the second reference voltage;
  determining whether the second cell of the pair is programmed above or below the third reference;
  establishing a second least significant bit (LSB2) of the three-bit data as a result of an XOR of the result of the determination as to whether the first cell of the pair is programmed above or below the third reference voltage and the determination as to whether the second cell of the pair is programmed above or below the third reference voltage; and reading from the MLC memory with an average number of references per sector of less than $(2^n-1)/n$, where $2^n$ is a number of levels of the MLC memory.

7. The method of claim 6, wherein the three-bit data are read from the pair of four-level cell memory with an average number of references per sector of less than 1.5.

* * * * *